US007033646B2

United States Patent
Zhang

(10) Patent No.: US 7,033,646 B2
(45) Date of Patent: Apr. 25, 2006

(54) HIGH RESISTANCE POLYANILINE BLEND FOR USE IN HIGH EFFICIENCY PIXELLATED POLYMER ELECTROLUMINESCENT DEVICES

(75) Inventor: Chi Zhang, Goleta, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 141 days.

(21) Appl. No.: 10/627,550

(22) Filed: Jul. 24, 2003

(65) Prior Publication Data

US 2005/0033014 A1     Feb. 10, 2005

Related U.S. Application Data

(60) Provisional application No. 60/406,708, filed on Aug. 29, 2002.

(51) Int. Cl.
*C08F 2/56*     (2006.01)
*C08F 228/00*   (2006.01)
*C08J 7/18*     (2006.01)
*C08G 73/00*    (2006.01)

(52) U.S. Cl. .................. 427/487; 428/690; 428/917; 528/422; 528/373; 528/391; 525/328.5; 525/329.4; 525/540; 525/535

(58) Field of Classification Search ............... 528/422, 528/373, 391; 525/328.5, 329.4, 510, 535, 525/540; 427/487; 428/690, 917
See application file for complete search history.

(56) References Cited

U.S. PATENT DOCUMENTS

| 4,552,927 A | 11/1985 | Warren |
| 2002/0098377 A1 | 7/2002 | Cao et al. |

FOREIGN PATENT DOCUMENTS

| EP | 0 813 212 A2 | 12/1997 |
| EP | 0 901 176 A2 | 3/1999 |
| JP | 05-262981 A | 10/1993 |
| WO | WO 01/41230 A1 | 6/2001 |

OTHER PUBLICATIONS

Cao, Yong et al., Influence of chemical polymerization conditions on the properties of polyaniline, Polymer, Dec. 1989, 2305-2311, 30, Butterworth & Co. (Publishers) Ltd.
Armes, Steven P. et al., Novel Colloidal Dispersions of Polyaniline, J. Chem. Soc., Chem. Commun., 1989, 88-89.
A. J. Sharpe, Jr. et al., Improved Cationic Conductive Polymer, Calgon Corp., Pittsburgh, PA, Coating Conference [Proceedings], pp. 83-87, 1981, ISSN 0364-2771.

*Primary Examiner*—Duc Truong

(57) ABSTRACT

Compositions are provided comprising polyaniline (PANI) with poly(2-acrylamido-2-methyl-1-propanesulfonic acid) (PAAMPSA) as the counterion (PANI/PAAMPSA) and an amount of poly(styrenesulfonic acid) (PSS) sufficient to reduce the conductivity of the composition relative to PANI/PAAMPSA. Invention compositions may further comprise poly(acrylamide) (PAM). Invention compositions are useful as high resistance buffer layers for use in electroluminescent devices (such as, organic light emitting diodes (OLEDs)).

2 Claims, 4 Drawing Sheets

HIGH RESISTANCE POLYANILINE BLEND FOR USE IN HIGH EFFICIENCY PIXELLATED POLYMER ELECTROLUMINESCENT DEVICES

FIELD OF THE INVENTION

The invention relates to the use of conductive organic polymers in the production of pixellated electroluminescent devices, such as, for example, polymer light emitting diodes.

BACKGROUND OF THE INVENTION

Conductive polymers originally attracted the attention of researchers over 20 years ago. The interest generated by these polymers compared to conventional conducting materials (e.g., metals) was largely due to factors such as light weight, flexibility, durability, and potential ease of processing. To date the most commercially successful conductive polymers are the polyanilines and polythiophenes, which are marketed under a variety of trade names.

More recently, conductive polymers have been used in the development of electroluminescent (EL) devices for use in light emissive displays. EL devices such as organic light emitting diodes (OLEDs) containing conductive polymers generally have the following configuration:

anode/buffer layer/EL polymer/cathode

The anode is typically any material that has the ability to inject holes into the otherwise filled π-band of the semiconducting, EL polymer, such as, for example, indium/tin oxide (ITO). The anode is optionally supported on a glass or plastic substrate. The EL polymer is typically a conjugated semiconducting polymer such as poly(paraphenylenevinylene) or polyfluorene. The cathode is typically any material (such as, e.g., Ca or Ba) that has the ability to inject electrons into the otherwise empty π*-band of the semiconducting, EL polymer.

The buffer layer is typically a conductive polymer and facilitates the injection of holes from the anode into the EL polymer layer. The buffer layer can also be called a hole-injection layer, a hole transport layer, or may be characterized as part of a bilayer anode. Typical conductive polymers employed as buffer layers are the emeraldine salt form of polyaniline (PANI) or a polymeric dioxythiophene doped with a sulfonic acid. The most widely used dioxythiophene is poly(3,4-ethylenedioxythiophene) doped with polystyrene sulfonic acid, abbreviated as PEDT/PSS. PEDT/PSS is available commercially from Bayer, as Baytron® P.

PANI/PAAMPSA is typically prepared in aqueous solution by oxidative polymerization of aniline in the presence of PAAMPSA (see, e.g.,; Cao, Y., et. al., *Polymer*, 30, (1989) 2305; Armes, S. P., et. al., *J. Chem. Soc., Chem. Comm.* (1989) 88). JP5-262981 describes a high molecular weight PSS as a PANI dispersant. WO20014120 describes the use of PSS as a water-soluble host polymer.

Although PANI has been used successfully as the buffer layer in certain types of OLEDs, the low electrical resistivity typical of PANI inhibits its use in pixellated displays. For pixellated displays, a buffer layer having a higher resistance (i.e., lower conductivity) than is provided by PANI is desired to eliminate or minimize crosstalk between neighboring pixels. Inter-pixel current leakage significantly reduces power efficiency and limits both the resolution and clarity of the display. Thus, while the buffer layer must have some electrical conductivity in order to facilitate charge transfer, the conductivity of PANI buffer layers is generally higher than necessary and hence limits the resolution and clarity of the display in which PANI is used as the buffer layer. Accordingly, there is a need for high resistance PANI buffer layers for use in electroluminescent devices and for methods of increasing resistance of PANI buffer layers.

SUMMARY OF THE INVENTION

The invention is based on the discovery that addition of poly(styrenesulfonic acid) (PSS) to compositions comprising polyaniline (PANI) with poly(2-acrylamido-2-methyl-1-propanesulfonic acid (PAAMPSA) as the counterion (PANI/PAAMPSA) results in a marked decrease in conductivity relative to PANI/PAAMPSA without added PSS. Thus, in one embodiment of the invention, there are provided compositions comprising PANI, PAAMPSA, and an amount of poly(styrenesulfonic acid) (PSS) sufficient to reduce the conductivity of said composition. In another embodiment of the invention, the composition further comprises poly(acrylamide) (PAM).

In yet another embodiment, there are provided high resistance buffer layers and high resistance films comprising PANI/PAAMPSA and PSS.

In a further embodiment of the invention, there are provided electronic devices comprising a low conductivity buffer layer. In a still further embodiment of the invention, there are provided organic light emitting diodes (OLEDs) containing high resistance buffer layers comprising PANI/PAAMPSA and PSS.

In still another embodiment of the invention, there are provided methods for reducing conductivity of PANI/PAAMPSA films cast from aqueous solution onto a substrate to a value less than about $1 \times 10^{-4}$ S/cm, by adding an effective amount of PSS to the aqueous solution.

DETAILED DESCRIPTION

Figure 1:
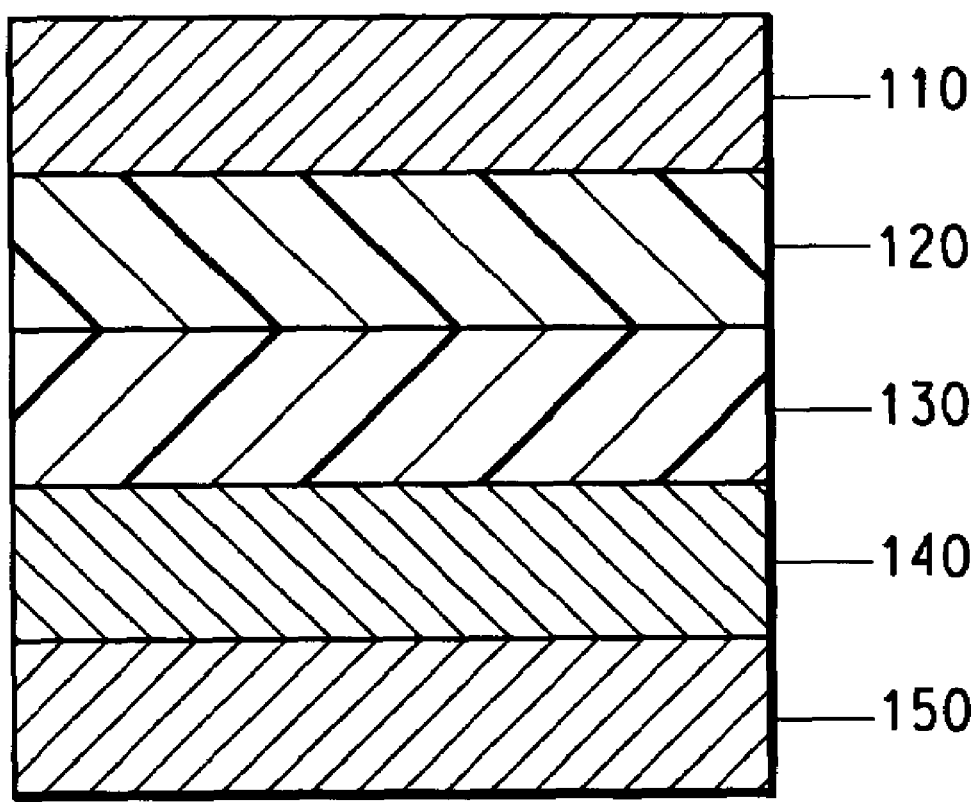
FIG. 1 illustrates a cross-sectional view of an electronic device that includes a buffer layer according to the invention.

In accordance with the invention, there are provided compositions comprising polyaniline (PANI), poly(2-acrylamido-2-methyl-1-propanesulfonic acid) (PAAMPSA), and an amount of poly(styrenesulfonic acid) (PSS) sufficient to reduce the conductivity of said composition.

In one embodiment, the compositions comprise polyaniline with poly(2-acrylamido-2-methyl-1-propanesulfonic acid) as the counterion (PANI/PAAMPSA), and an amount of poly(styrenesulfonic acid) (PSS) sufficient to reduce the conductivity of the composition. Invention compositions are prepared by dispersing a given amount of each component in aqueous solution. The weight % ratio of PANI/PAAMPSA:PSS in a polymeric film cast from solution can be controlled simply by varying the amount of PSS dispersed into the aqueous PANI/PAAMPSA solution (weight % (wt %) refers to percent by weight of the total solution). In one embodiment of the invention, the weight % ratio of PANI/PAAMAPSA:PSS is in the range of about 1:0.05 up to about 1:2. In a further embodiment, the weight % ratio of PANI/PAAMPSA:PSS is in the range of about 1:0.2 up to about 1:1. In embodiments of the invention wherein the composition contains PAM, the weight % ratio of PANI/PAAMPSA:PAM is in the range of about 1:0.5 up to about 1:2.

In accordance with another embodiment of the invention, there are provided high resistance (low conductivity) buffer layers for use in electroluminescent devices, wherein the buffer layers comprise PANI/PAAMPSA, and an amount of PSS sufficient to reduce the conductivity of the buffer layer relative to a PANI/PAAMPSA buffer layer without added PSS. In one embodiment, the high resistance buffer layer further comprises polyacrylamide (PAM).

Electrical resistivity is inversely proportional to electrical conductivity. Thus, as employed herein, the phrases "high resistance" and "low conductivity" are used interchangeably with reference to the buffer layers described herein. As used herein, the phrases "high resistance" and "low conductivity" each refer to a conductivity level less than that of commercially available PANI/PAAMPSA, i.e., less than about $5.1 \times 10^{-4}$ S/cm. Resistivity and conductivity values are typically reported in units of ohm-centimeter (ohm-cm) and Siemens per centimeter (S/cm), respectively. As used herein, conductivity values are reported using the unit S/cm rather than resistivity values.

By incorporation of PSS into a PANI/PAAMPSA buffer layer, the conductivity of the buffer layer can be reduced by more than two orders of magnitude. In one embodiment of the invention, the buffer layers have a conductivity of less than about $1 \times 10^{-4}$ S/cm. In another embodiment, the buffer layers have a conductivity of less than about $1 \times 10^{-6}$ S/cm.

The conductivity of invention buffer layers can be reduced without reducing layer thickness (buffer layers comprising PANI/PPAAMPSA typically have a thickness greater than 2000 Å). This is an attractive benefit provided by the invention since thin buffer layers often give rise to electrical shorts. Thus, by incorporation of PSS into the buffer layer, conductivities as low as about $10^{-6}$ S/cm are observed for layers with a thickness of greater than 2000 Å.

In accordance with still another embodiment of the invention, there are provided methods for reducing conductivity of a PANI/PAAMPSA-PAM film cast from aqueous solution onto a substrate to a value less than about $1 \times 10^{-4}$ S/cm, the method comprising adding an effective amount of PSS to the aqueous solution. In one embodiment of the invention, the conductivity of the film is less than about $1 \times 10^{-6}$ S/cm.

PANI/PAAMPSA layers comprising PSS prepared according to the invention may be cast onto substrates using a variety of techniques well-known to those skilled in the art. Casting is typically carried out at room temperature, although casting may also be carried out at higher or lower temperatures as known in the art. The buffer layers are typically cast from a variety of aqueous solutions, such as, water, mixtures of water with water soluble alcohols, mixtures of water with tetrahydrofuran (THF), mixtures of water with dimethyl sulfoxide (DMSO), mixtures of water with dimethylformamide (DMF), or mixtures of water with other water-miscible solvents.

In still another embodiment of the invention, there are provided electronic devices comprising at least one buffer layer of the invention, wherein the buffer layer preferably has a conductivity of less than about $1 \times 10^{-4}$ S/cm. As shown in FIG. 1, a typical device has an anode layer 110, a buffer layer 120, an electroluminescent layer 130, and a cathode layer 150. Adjacent to the cathode layer 150 is an optional electron-injection/transport layer 140. Between the buffer layer 120 and the cathode layer 150 (or optional electron injection/transport layer 140) is the electroluminescent layer 130.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8–10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include indium-tin-oxide ("ITO"), aluminum-tin-oxide, gold, silver, copper, and nickel. The anode may also comprise an organic material such as polyaniline.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as e-beam evaporation and resistance evaporation. Specific forms of physical vapor deposition include rf magnetron sputtering or inductively-coupled plasma physical vapor deposition ("IMP-PVD"). These deposition techniques are well known within the semiconductor fabrication arts.

Usually, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

The buffer layer 120 is usually cast onto substrates using a variety of techniques well-known to those skilled in the art. Typical casting techniques include, for example, solution casting, drop casting, curtain casting, spin-coating, screen printing, inkjet printing, and the like. Alternatively, the buffer layer can be patterned using a number of such processes, such as ink jet printing.

The electroluminescent (EL) layer 130 may typically be a conjugated polymer such as poly(paraphenylenevinylene) or polyfluorene. The particular material chosen may depend on the specific application, potentials used during operation, or other factors. The EL layer 130 containing the electroluminescent organic material can be applied from solutions by any conventional technique, including spin-coating, casting, and printing. The EL organic materials can be applied directly by vapor deposition processes, depending upon the nature of the materials. In another embodiment, an EL polymer precursor can be applied and then converted to the polymer, typically by heating or other source of external energy (e.g., visible light or UV radiation).

Optional layer 140 can function both to facilitate electron injection/transport, and also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include metal-chelated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, LiF, $Li_2O$, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include barium, lithium, cerium, cesium, europium, rubidium, yttrium, magnesium, and samarium.

The cathode layer 150 is usually formed by a chemical or physical vapor deposition process. In general, the cathode layer will be patterned, as discussed above in reference to the anode layer 110. If the device lies within an array, the cathode layer 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view).

In other embodiments, additional layer(s) may be present within organic electronic devices. For example, a layer (not shown) between the buffer layer 120 and the EL layer 130 may facilitate positive charge transport, band-gap matching of the layers, function as a protective layer, or the like. Similarly, additional layers (not shown) between the EL layer 130 and the cathode layer 150 may facilitate negative charge transport, band-gap matching between the layers, function as a protective layer, or the like. Layers that are known in the art can be used. In addition, any of the above-described layers can be made of two or more layers. Alternatively, some or all of inorganic anode layer 110, the buffer layer 120, the EL layer 130, and cathode layer 150, may be surface treated to increase charge carrier transport efficiency. The choice of materials for each of the component layers may be determined by balancing the goals of providing a device with high device efficiency with the cost of manufacturing, manufacturing complexities, or potentially other factors.

Although not meant to limit, the different layers may have the following range of thicknesses: inorganic anode layer 110, usually no greater than approximately 500 nm, for example, approximately 10–200 nm; buffer layer 120, usually no greater than approximately 250 nm, for example, approximately 20–200 nm; EL layer 130, usually no greater than approximately 1000 nm, for example, approximately 10–80 nm; optional layer 140, usually no greater than approximately 100 nm, for example, approximately 20–80 nm; and cathode layer 150, usually no greater than approximately 100 nm, for example, approximately 1–50 nm. If the anode layer 110 or the cathode layer 150 needs to transmit at least some light, the thickness of such layer may not exceed approximately 100 nm.

Depending upon the application of the electronic device, the EL layer 130 can be a light-emitting layer that is activated by a signal (such as in a light-emitting diode) or a layer of material that responds to radiant energy and generates a signal with or without an applied potential (such as detectors or voltaic cells). Examples of electronic devices that may respond to radiant energy are selected from photoconductive cells, photoresistors, photoswitches, phototransistors, and phototubes, and photovoltaic cells. After reading this specification, skilled artisans will be capable of selecting material(s) that are suitable for their particular applications. The light-emitting materials may be dispersed in a matrix of another material, with or without additives, but preferably form a layer alone. The EL layer 130 generally has a thickness in the range of approximately 50–500 nm.

In organic light emitting diodes (OLEDs), electrons and holes, injected from the cathode 150 and anode 110 layers, respectively, into the EL layer 130, form negative and positively charged polarons in the polymer. These polarons migrate under the influence of the applied electric field, forming a polaron exciton with an oppositely charged species and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s) may be electrically connected to the electronic device as part of a circuit but is not illustrated in FIG. 1.

In accordance with still another embodiment of the invention, there are provided methods for reducing conductivity of a PANI/PAAMPSA:PAM film cast from aqueous solution onto a substrate to a value less than about $1 \times 10^{-4}$ S/cm, the method comprising adding an effective amount of PSS to the aqueous solution. In one embodiment of the invention, the conductivity of the film is less than about $1\times10^{-6}$ S/cm.

In a further embodiment of the invention, it has been discovered that drying conditions of PANI/PAAMPSA:PSS layers cast onto a substrate may be greatly simplified. For example, PANI/PAAMPSA:PSS layers prepared according to the invention can be dried at temperatures of less than about 90° C. These milder drying temperatures (relative to typical drying temperatures of greater than about 200° C.) are desirable for flexible LED applications.

The invention will now be described in greater detail by reference to the following non-limiting examples.

EXAMPLES

Example 1

In this example, the preparation of PANI/PAAMPSA is described. PANI/PAAMPSA was prepared using a procedure similar to that described in WO 01/41230, more specifically, as described below.

PANI/PAAMPSA was prepared using a procedure similar to that described in the reference Y. Cao, et al., *Polymer*, 30 (1989) 2305, more specifically, as described below. HCl in this reference was replaced by poly(2-acrylamido-2-methyl-1-propanesulfonic acid) (PAAMPSA) (available from Aldrich, Milwaukee, Wis. 53201).

The emeraldine salt (ES) form was verified by the typical green color. First, 30.5 g (0.022 mole) of 15% PAAMPSA in water (Aldrich) was diluted to 2.3% by adding 170 ml water. While stirring, 2.2 g (0.022M) aniline was added into the PAAMPSA solution. 2.01 g (0.0088M) of ammonium persulfate in 10 ml water was added slowly into the aniline/PAAMPSA solution under vigorous stirring. The reaction mixture was stirred for 24 hours at room temperature. To precipitate the product, PANI/PAAMPSA, 1000 ml of acetone was added into reaction mixture. Most of acetone/water was decanted and then the PANI/PAAMPSA precipitate was filtered. The resulting gum-like product was washed several times with acetone and dried at 40° C. under dynamic vacuum for 24 hours.

This Example demonstrates an exemplary synthesis of PANI/PAAMPSA.

Example 2

One gram (1.0 g) of the PANI/PAAMPSA powder as prepared in Example 1 was mixed with 100 g of deionized water in a plastic bottle. The mixture was rotated at room temperature for 48 hours. The solutions/dispersions were then filtered through 0.45 μm polypropylene filters. Different concentrations of PANI/PAAMPSA in water are routinely prepared by changing the quantity of PANI/PAAMPSA mixed into the water.

This Example demonstrates that PANI/PAAMPSA can be dissolved/dispersed in water and subsequently filtered through a 0.45 μm filter.

Example 3

Four grams (4.0 g) of polyacrylamide (PAM) (M.W. 5,000,000–6,000,000, available from Polysciences (Warrinton, Pa. 18976)) was mixed with 400 ml deionized water in a plastic bottle. The mixture was rotated at room temperature for at least 48 hours. The solution/dispersion was then filtered through 1 μm polypropylene filters. Different concentrations of PAM are routinely prepared by changing the quantity of PAM dissolved.

This Example demonstrates that PAM can be dissolved/dispersed in water and subsequently filtered through a 1 μm filter.

Example 4

20 g of a PANI/PAAMPSA solution as prepared in Example 2 was mixed (at room temperature for 12 days) with 10 g of 1 wt % PAM solution as prepared in Example 3 and 2.0 g of 15% PAAMPSA solution (available from Aldrich). The solution was then filtered through 0.45 μm polypropylene filters. The weight ratio of PANI/PAAMPSA:PAM:PAAMPSA was 1:0.5:1.5. Different blend ratios of the PANI/PAAMPSA:PAM:PAAMPSA blend solutions are prepared by changing the concentrations in the starting solutions.

Example 5

30 g of a solution as prepared in Example 2 was mixed with 15 g of deionized water and 0.6 g of PAM (M.W. 5,000,000–6,000,000, available from Polysciences) under stirring at room temperature for 4–5 days. The ratio of PANI/PAAMPSA to PAM in the blend solution was 1:2. Blend solutions were also prepared in which the content of PANI/PAAMPSA was 0, 10, 25 and 40%, respectively.

Example 6

16.7 g of a PANI/PAAMPSA solution as prepared in Example 2 was mixed (at room temperature for 2–4 days) with 10.1 g of 1.67 wt % PAM solution as prepared in Example 3 and 0.55 g of 30% poly(stylenesulfonic acid) (PSS) solution (available from Polysciences, Warrinton, Pa. 18976). The solution was then filtered through 0.45 μm polypropylene filters. The weight ratio of PANI/PAAMPSA:PSS:PAM in the blend solution was 1:1:1. Different blend ratios of the PANI/PAAMPSA:PSS:PAM blend solutions are prepared by changing the concentrations in the starting solutions.

EXAMPLE 7

25 g of a PANI/PAAMPSA:PAM solution as prepared in Example 5 was mixed (at room temperature for 2–4 days) with 0.35 g of 30% poly(stylenesulfonic acid) (PSS) solution (available from Polysciences). The solution was then filtered through 0.45 μm polypropylene filters. The weight ratio of PANI/PAAMPSA:PAM:PSS in the blend solution was 1:0.2:2. Different blend ratios of the PANI/PAAMPSA:PSS:PAM blend solutions are prepared by changing the concentrations in the starting solutions.

Example 8

An alternative treatment of the solution as prepared in Example 6 was performed. In this case, the PANI/PAAMPSA:PSS:PAM solution was subjected to sonication in an ultrasonic bath for 1 hour prior to filtration.

Example 9

Glass substrates were prepared with patterned ITO electrodes. Using the blend solutions as prepared in Examples 2, 4, 5, 6, 7 and 8, polyaniline blend layers were spin-cast on top of the patterned substrates and thereafter, baked at 90° C. in a vacuum oven for 0.5 hour. The resistance between ITO electrodes was measured using a high resistance Keithley 487 Picoammeter, from Keithley Instruments Inc., (Cleveland, Ohio 44139). Table 1 shows the conductivity of PANI blend films with different blend compositions. As can be seen from Table 1, the conductivity can be controlled over a wide range.

This Example demonstrates that the PANI/PAAMPSA blends can be prepared with bulk conductivities less than $10^{-4}$ S/cm, and even less than $10^{-6}$ S/cm, by incorporating PSS into the blend. These conductivities are sufficiently low that interpixel current leakage can be limited without need for patterning the PANI/PAAMPSA blend film.

in both cases, an ITO/(PANI/PAAMPSA:PSS:PAM) bilayer was the anode and the hole-injecting contact. Devices were made with a layer of Ba as the cathode. The metal cathode film was fabricated on top of the C-PPV layer using vacuum vapor deposition at pressures below $1\times10^{-6}$ Torr yielding an active layer with area of 3 cm$^2$. The deposition was monitored with a STM-100 thickness/rate meter, available from Sycon Instruments, Inc., (East Syracuse, N.Y. 13057). 2,000 Å to 5,000 Å of aluminum was deposited on top of the calcium layer. For each of the devices, the current vs. voltage curve, the light vs. voltage curve, and the quantum efficiency were measured. The external efficiency of the device with bilayer ITO/(PANI/PAAMPSA:PSS:PAM) anode is significantly higher than a device with ITO anode.

TABLE 1

Conductivity of PANI/PAAMPSA films comprising PSS

| PANI Blend | Composition (w:w:w) | Baking Condition | Thickness (Å) | Conductivity (S/cm) |
|---|---|---|---|---|
| PANI/PAAMPSA | 1:0:0 | 90° C./30 min | 426 | $5.1 \times 10^{-4}$ |
| PANI/PAAMPSA:PAM:PAAMPSA | 1:0.5:1.5 | 90° C./30 min | 2030 | $1.4 \times 10^{-4}$ |
| PANI/PAAMPSA:PAM | 1:2:0 | 200° C./30 min | 1986 | $7.4 \times 10^{-7}$ |
| PANI/PAAMPSA:PSS | 1:2:0 | 90° C./30 min | 1249 | $<7.5 \times 10^{-8}$ |
| PANI/PAAMPSA:PSS:PAM | 1:1.5:05 | 90° C./30 min | 1702 | $7.8 \times 10^{-6}$ |
| PANI/PAAMPSA:PSS:PAM | 1:1:1 | 90° C./30 min | 2847 | $1.6 \times 10^{-6}$ |
| PANI/PAAMPSA:PSS:PAM | 1:1:1 | 90° C./30 min | 1110 | $4.2 \times 10^{-7}$ |
| PANI/PAAMPSA:PSS:PAM | 1:0.5:1.5 | 90° C./30 min | 5380 | $1.3 \times 10^{-5}$ |
| PANI/PAAMPSA:PSS:PAM | 1:0.2:2 | 90° C./30 min | 1713 | $<5.5 \times 10^{-8}$ |
| PANI/PAAMPSA:PSS:PAM | 1:0.05:1.95* | 90° C./30 min | 641 | $1.5 \times 10^{-7}$ |

*with ultrasonic treatment.

Example 10

Light emitting diodes were fabricated using soluble poly(1,4 phenylenevinylene) copolymer (C-PPV), prepared by copolymerization of phenyl-substituted PPV monomers (H. Becker, H. Spreitzer, W. Kreduer, E. Kluge, H. Schenk, I. D. Parker and Y. Cao, Adv. Mater. 12, 42 (2000), as the active semiconducting, luminescent polymer; the thickness of the C-PPV films was 500–1000 Å. Indium/tin oxide was used as the first layer of the bilayer anode. PANI/PAAMPSA:PSS:PAM (of Example 6) was spin-coated from the solution/dispersion in water onto ITO with thickness ranging from 1000 to 3000 Å, and thereafter, baked at 90° C. in vacuum oven for 0.5 hour. The device architecture was ITO/(PANI/PAAMPSA:PSS:PAM)/C-PPV/metal. Devices were fabricated using both ITO on glass as the substrate (Applied ITO/glass) and using ITO on plastic, i.e., polyethylene terephthalate (PET), as the substrate (Courtauld's ITO/PEI);

This Example demonstrates that high performance polymer LEDs can be fabricated using PANI/PAAMPSA:PSS:PAM as the second layer of the bilayer anode.

Example 11

The device measurements in Example 10 were repeated, but the PANI blend layer was spin-cast from the blend solutions as prepared in Examples 4, 5, 6 and 7. Table 2 shows the device performance of LEDs fabricated from polyblend films with different host polymers.

This Example demonstrates that the use of PANI/PAAMPSA blends can be used to fabricate polymer LEDs with significantly higher efficiency; this higher efficiency is obtained because inter-pixel current leakage has been significantly reduced by using the high resistance PANI blend as the buffer layer.

TABLE 2

Performance of devices fabricated with different PANI blends[#]

| PANI Blend | Composition (w:w:w) | Baking Condition | Voltage (V) | Efficiency (cd/A) |
|---|---|---|---|---|
| PANI/PAAMPSA | 1:0:0 | 90° C./30 min | 4.7 | 7.4 |
| PANI/PAAMPSA:PAM | 1:2:0 | 200° C./30 min | 6.6 | 7.2 |
| PANI/PAAMPSA:PSS | 1:2:0 | 90° C./30 min | 4.8 | 0.3 |
| PANI/PAAMPSA:PSS:PAM | 1:1.5:05 | 90° C./30 min | 4.6 | 10.1 |
| PANI/PAAMPSA:PSS:PAM | 1:1:1 | 90° C./30 min | 4.9 | 8.8 |
| PANI/PAAMPSA:PSS:PAM | 1:1:1 | 90° C./30 min | 4.4 | 7.8 |

[#]at 8.3 mA/cm$^2$.

Example 12

Figure 2:
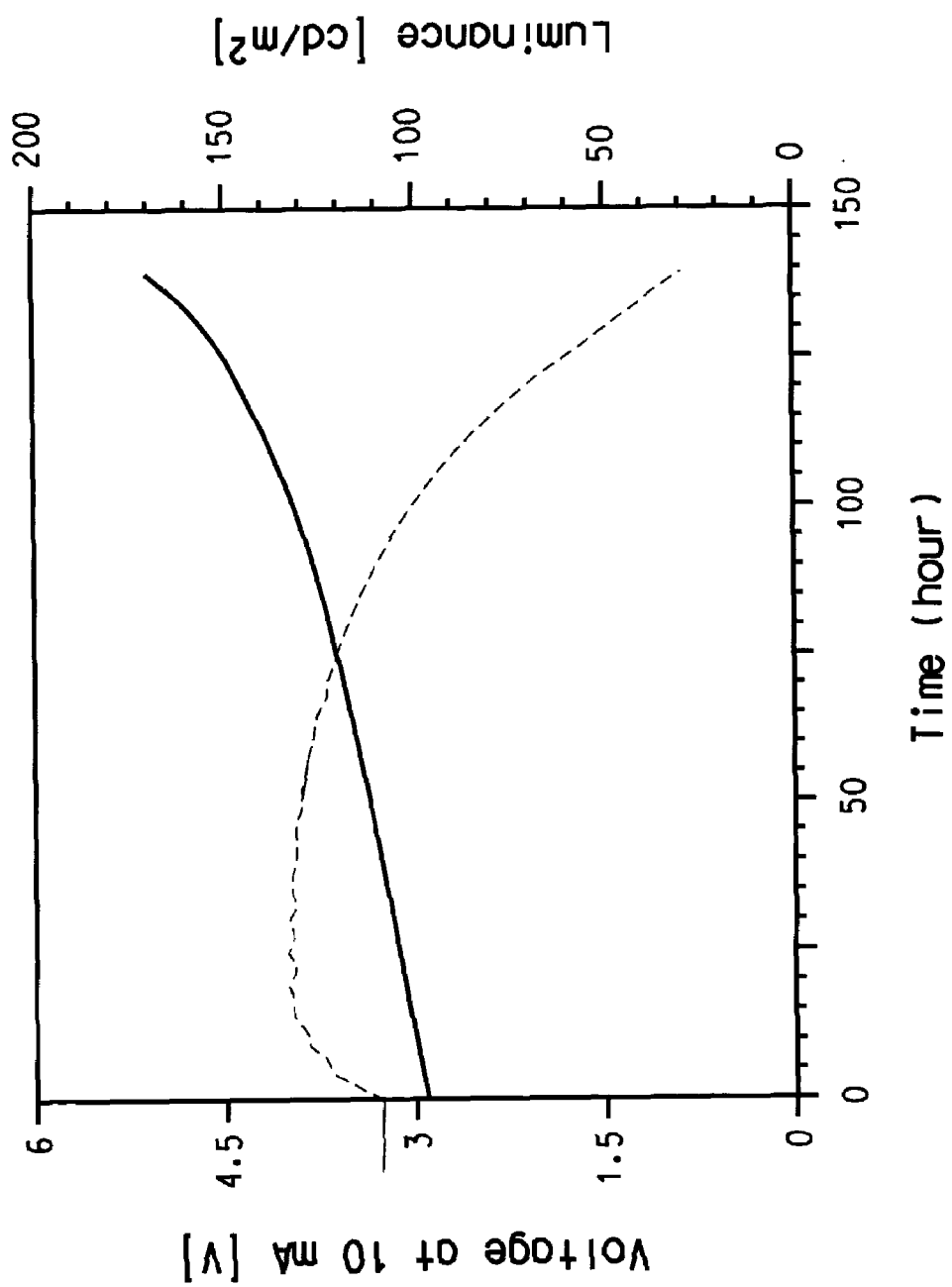
FIG. 2 is a graph which shows the stress induced degradation of devices with PANI/PAAMPSA:PSS:PAM (1:1:1) layer at 80° C. The PANI/PAAMPSA:PSS:PAM (1:1:1) layer was dried at 90° C. in a vacuum oven for 30 minutes. Solid lines represent operating voltage and dashed lines represent light output.

The device of Example 10 was encapsulated using a cover glass sandwiched by UV curable epoxy. The encapsulated devices were run at a constant current in an oven at temperatures 80° C. The total current through the devices was 10 mA with luminance of approximately 150 cd/cm$^2$. FIG. 2 shows the light output (solid line) and voltage increase (dashed line) during operation at 80° C. In contrast to devices with PANI/PAAMPSA:PAM (1:2) dried at 85° C. vacuum oven for 30 minutes, which degrade within 10 hours of stress at 80° C., the half life of the devices with the PANI/PAAMPSA:PSS:PAM (1:1:1) dried at the same condition exceeds 100 hours with a low voltage increase (10.0 mV/hour). From Ahrennius plots of the luminance decay and voltage increase data collected at 50, 70 and 85° C., the temperature acceleration factor was estimated to be ca. 35. Thus, the extrapolated stress life at room temperature was determined to be approximately 3,500 hours.

This Example demonstrates that long lifetime can be obtained for organic LEDs fabricated with high resistance PANI/PAAMPSA:PSS:PAM layers dried at 90° C. vacuum oven.

Example 13

Figure 3:
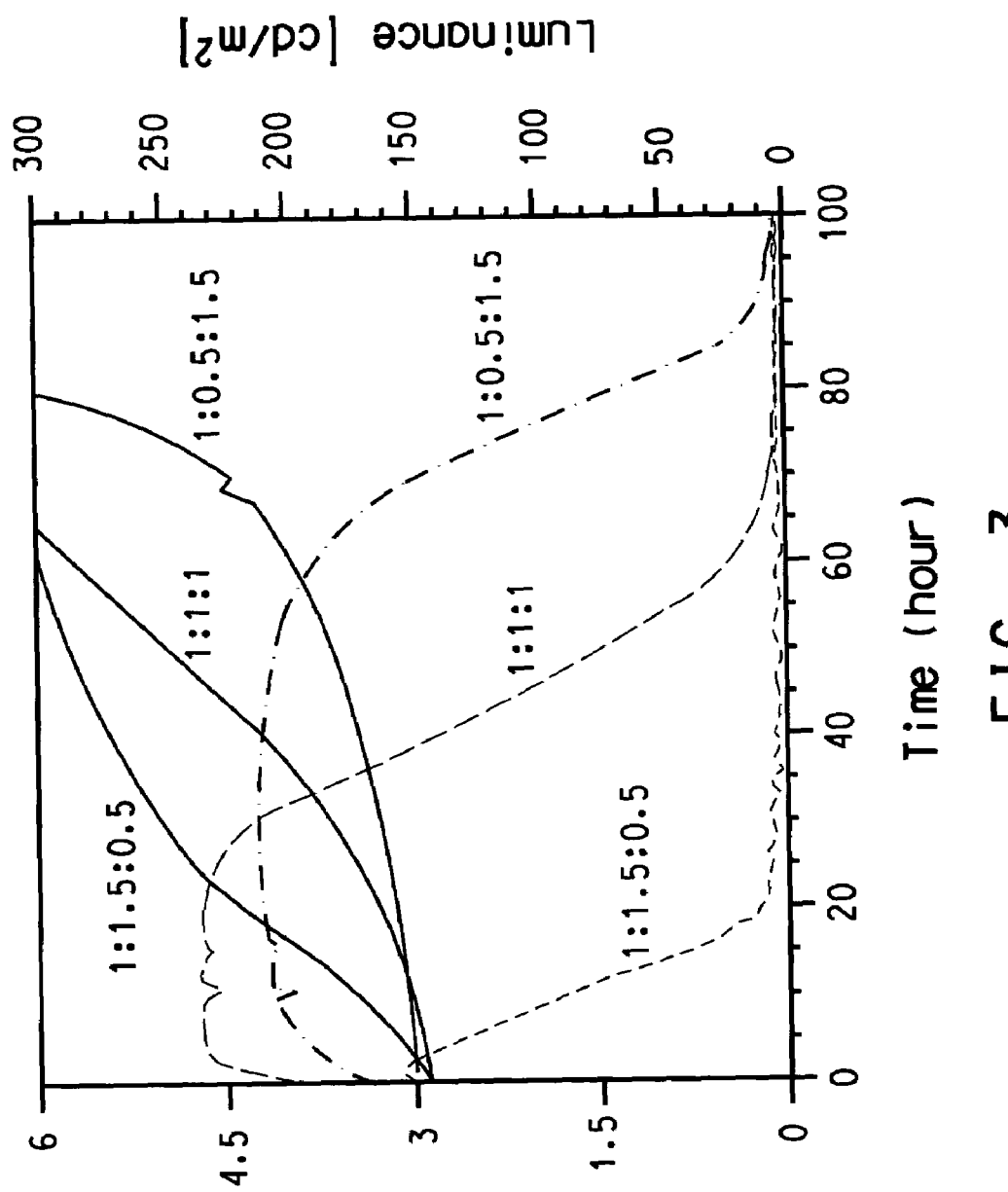
FIG. 3 is a graph which shows the stress induced degradation of devices with different PANI/PAAMPSA:PSS:PAM ratios at 80° C. The PANI/PAAMPSA:PSS:PAM layer was dried at 90° C. in a vacuum oven for 30 minutes. Solid lines represent operating voltage and dashed lines represent light output.

Examples 10 and 12 were repeated, but a different PANI/PAAMPSA:PSS:PAM ratio (Example 6) was used for the buffer layer. FIG. 3 shows the luminance (dashed lines) and voltage (at constant current) (solid lines) vs time during stress at 7.4 mA with the device at 80° C.

This Example demonstrates that long lifetime, high performance displays can be fabricated using the PANI/PAAMPSA:PSS:PAM blend as the buffer layer.

Example 14

Figure 4:
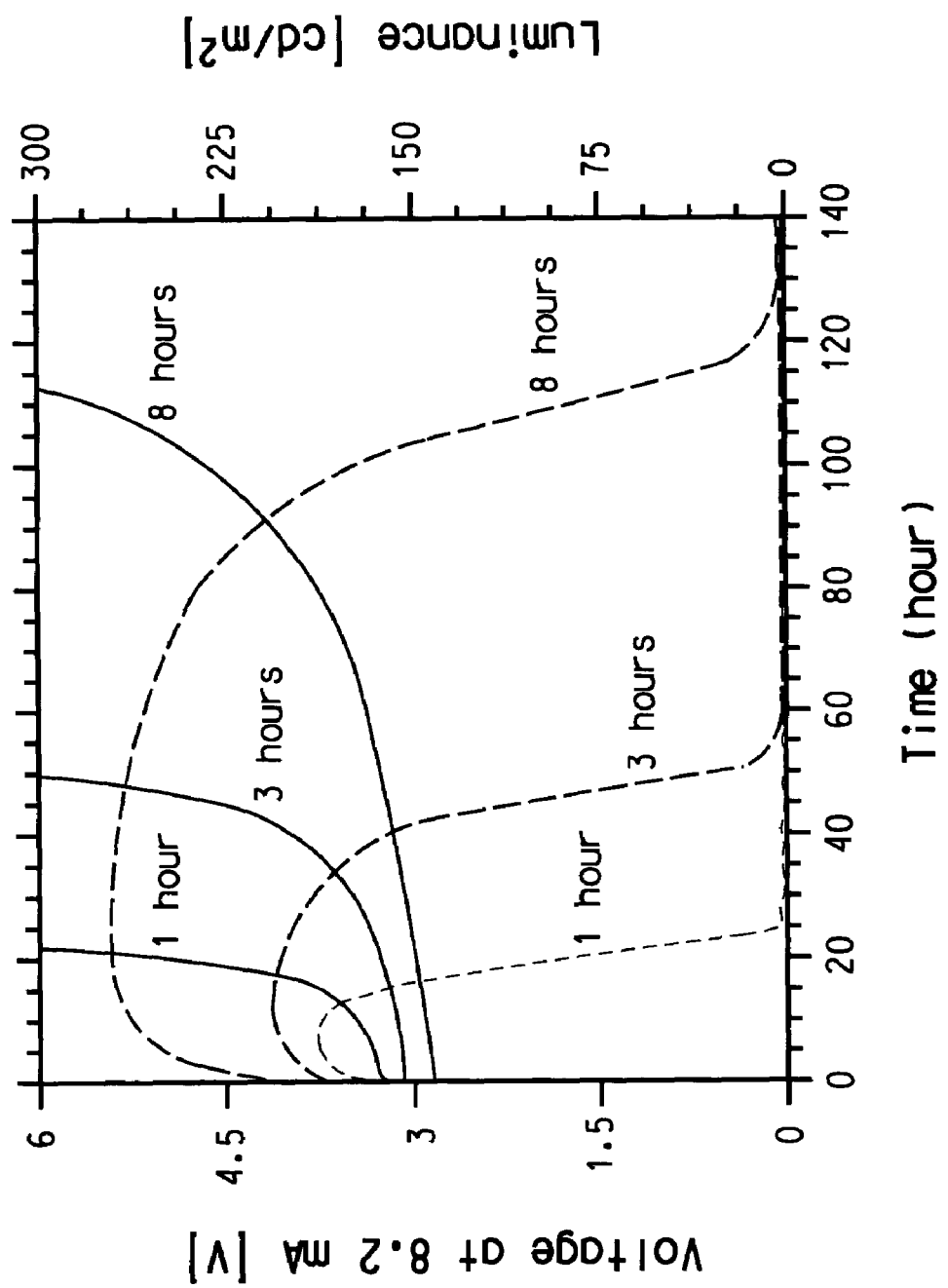
FIG. 4 is a graph which shows the stress induced degradation of devices of PANI/PAAMPSA:PSS:PAM (1:0.05:1.95) with different sonication treatment time at 80° C. The PANI/PAAMPSA:PSS:PAM layer was dried at 90° C. vacuum oven for 30 minutes. Solid lines represent operating voltage and dashed lines represent light output.

Examples 10 and 12 were repeated, but PANI/PPAAMPSA:PSS:PAM solution (Example 9) was used for the buffer layer. FIG. 4 shows the luminance (dashed lines) and voltage (at constant current) (solid lines) vs time during stress at 8.2 mA with the device at 80° C.

This Example demonstrates that long lifetime, high performance displays can be fabricated using the PANI/PAAMPSA:PSS:PAM blend as the buffer layer.

While the invention has been described in detail with reference to certain preferred embodiments thereof, it will be understood that modifications and variations are within the spirit and scope of that which is described and claimed.

What is claimed is:

1. An electronic device comprising a high resistance buffer layer made from the composition comprising an aqueous solution of polyaniline with poly(2-acrylamido-2-methyl-1-propanesulfonic acid) as the counterion (PANI/PAAMPSA), poly(styrenesulfonic acid) (PSS), and polyacrylamide (PAM), wherein the PANI/PAAMPSA:PSS weight % ratio is in the range of about 1:0.05 up to about 1:2, and the PANI/PAAMPSA:PAM weight % ratio is in the range of about 1:0.5 up to about 1:2, wherein said aqueous solution is subjected to sonication treatment.

2. An electronic device according to claim 1, wherein the sonication treatment is carried out for from about 1 to about 8 hours.

* * * * *